United States Patent [19]
Nyqvist et al.

[11] Patent Number: 5,241,284
[45] Date of Patent: Aug. 31, 1993

[54] CIRCUIT ARRANGEMENT FOR CONNECTING RF AMPLIFIER AND SUPPLY VOLTAGE FILTER

[75] Inventors: Jouni Nyqvist, Muurla; Risto Huusko, Salo, both of Finland

[73] Assignee: Nokia Mobile Phones Ltd., Salo, Finland

[21] Appl. No.: 884,042

[22] Filed: May 14, 1992

Related U.S. Application Data

[63] Continuation of Ser. No. 643,559, Jan. 17, 1991, abandoned.

[30] Foreign Application Priority Data

Feb. 16, 1990 [FI] Finland ............................ 900803

[51] Int. Cl.⁵ .................................................. H03F 1/34
[52] U.S. Cl. ........................ 330/297; 330/303; 330/306
[58] Field of Search ............. 330/297, 296, 290, 285, 330/148, 302, 303, 294, 306

[56] References Cited

U.S. PATENT DOCUMENTS

| | | | |
|---|---|---|---|
| 3,422,365 | 1/1969 | Wooster | 330/28 |
| 3,559,088 | 1/1971 | Booth et al. | 330/285 |
| 3,571,761 | 3/1971 | Meek | 330/303 |
| 3,581,122 | 5/1971 | Gaunt, Jr. | 330/294 |
| 3,671,884 | 6/1972 | Denny, Jr. | 332/16 T |
| 3,860,881 | 1/1975 | Etherington et al. | 330/302 |
| 3,886,467 | 5/1975 | Watanabe et al. | 330/302 |
| 3,949,306 | 4/1976 | Watanabe et al. | 330/307 |
| 4,087,762 | 5/1978 | Ashley | 330/294 |
| 4,090,150 | 5/1978 | Vachenauer | 330/294 |

FOREIGN PATENT DOCUMENTS

| | | | |
|---|---|---|---|
| 0176069 | 4/1986 | European Pat. Off. | |
| 2712680 | 9/1978 | Fed. Rep. of Germany | |
| 52-28844 | 4/1977 | Japan | 330/297 |
| 61-84908 | 4/1986 | Japan | 330/290 |
| WO91/16761 | 10/1991 | PCT Int'l Appl. | 330/302 |

*Primary Examiner*—Robert J. Pascal
*Assistant Examiner*—Tan Dinh
*Attorney, Agent, or Firm*—Darby & Darby

[57] ABSTRACT

A circuit arrangement in which an RF amplifier circuit also acts as a filter for a second supply voltage which is produced from the supply voltage ($V_{cc}$out) of the amplifier. The high frequency RF amplifier circuit comprises a common emitter transistor with ancillary components, and the emitter is connected through a capacitor to the ground of the circuit. From the emitter of the transistor is obtained the second supply voltage ($V_{cc}$out) in which the filter circuit is said high frequency amplifier circuit wherein the transistor is used as an emitter follower. With the circuit arrangement of the invention, the separate high frequency amplifier circuit and the filtering circuit of the second supply voltage, both known of prior art, can be combined.

8 Claims, 3 Drawing Sheets

CIRCUIT ARRANGEMENT FOR CONNECTING RF AMPLIFIER AND SUPPLY VOLTAGE FILTER

This is a continuation, in-part, of application Ser. No. 643,559, filed Jan. 17, 1991, as now abandoned.

BACKGROUND OF THE INVENTION

The invention relates to a circuit in which an RF amplifier circuit also serves as a filter for a supply voltage produced from the supply voltage of the amplifier.

Usually a high frequency amplifier, primarily a radio frequency amplifier, has been implemented using a common emitter transistor i.e. the radio frequency signal to be amplified is applied to the transistor base and the amplified output signal is obtained from the collector circuit. The emitter of the transistor has in general been connected directly to the ground of the circuit. As is known in the art, the operating point of the transistor is set from the supply voltage using resistors, and the DC separation of the input and the output is performed by means of capacitors. The collector current is determined with base current, which in turn is determined by the resistance division which sets the operating point. Because of the temperature dependence of the base-emitter voltage, a temperature compensation of the bias voltage of the transistor is made, for instance, by using a diode or resistive counteraction obtained through the collector line. If the emitter has been connected to the ground of the circuit through a resistor and the emitter voltage is high, the junction voltage of the base emitter will not essentially change the collector current, whereas, on the other hand, power losses take place in the resistor connected to the emitter, through which resistor flows the emitter current approaching the magnitude of collector current runs.

The filtering of the supply voltage may be arranged in a number of ways as is known in the art. One of the basic ways is to use a simple RC filter. For such a filter to be appropriate in filtering a supply voltage line, a high ohm resistor and a high capacitance capacitor should be used. Hereby, a drawback is the great voltage loss produced by the loading current passing through the resistor and also the power loss produced herewith. A very small resistor, cannot be used because the filtering effect will be less. Another, a more profitable way is to use an emitter follower circuit in which the supply voltage to be filtered is applied to the collector of the transistor, the base of which has, through a resistor, been connected to the supply voltage to be filtered and to the ground through a capacitor. A filtered supply voltage is received from the transistor emitter. In the circuit the main current travels through the collector, and the base current, that is, the current passing through the resistor, has been reduced to a $\beta$ (beta) part, compared with the current passing through the simple RC filter whereby a high RC input can be used.

It has been a practice to date that the above described high frequency amplifier has been a separate circuit of its own and that the filtered supply voltage needed by other circuits has been produced using a separate circuit similar to the one described above. This has naturally added to the number of components required.

SUMMARY OF THE INVENTION

The present invention introduces a circuit arrangement with which the shortcomings of separate amplifier and filter circuits can be eliminated and with which the current passing through the amplifier transistor can be used twice: first, in conjunction with amplifying the input signal of the amplifier, and second, as the current for the supply voltage to be produced.

The circuit arrangement is characterized in that a high frequency amplifier circuit comprises a common emitter transistor (Q1) with ancillary components, the emitter being connected through the capacitor (C5) to the ground of the circuit, and that a second supply voltage ($V_{cc}$out) is received from the emitter of the transistor (Q1), the filter circuit whereof being said high frequency amplifier circuit in which the transistor (Q1) acts as an emitter follower.

Therefore, the basic circuit of the invention comprises a common emitter amplifier including a transistor with ancillary components. Said amplifier circuit acts as a filter for a supply voltage which is taken from the emitter of the transistor. The transistor acts thus in the manner of filter circuits known in the art in the form of emitter follower in the filter in addition to RF amplifier activity. With said circuit, two separate circuits have been connected into one circuit provided with two operations.

BRIEF DESCRIPTION OF THE DRAWING

The circuit arrangement of the invention is described below more concretely, referring to the accompanying drawings in which.

DESCRIPTION OF THE PREFERRED EMBODIMENTS

Figure 1:
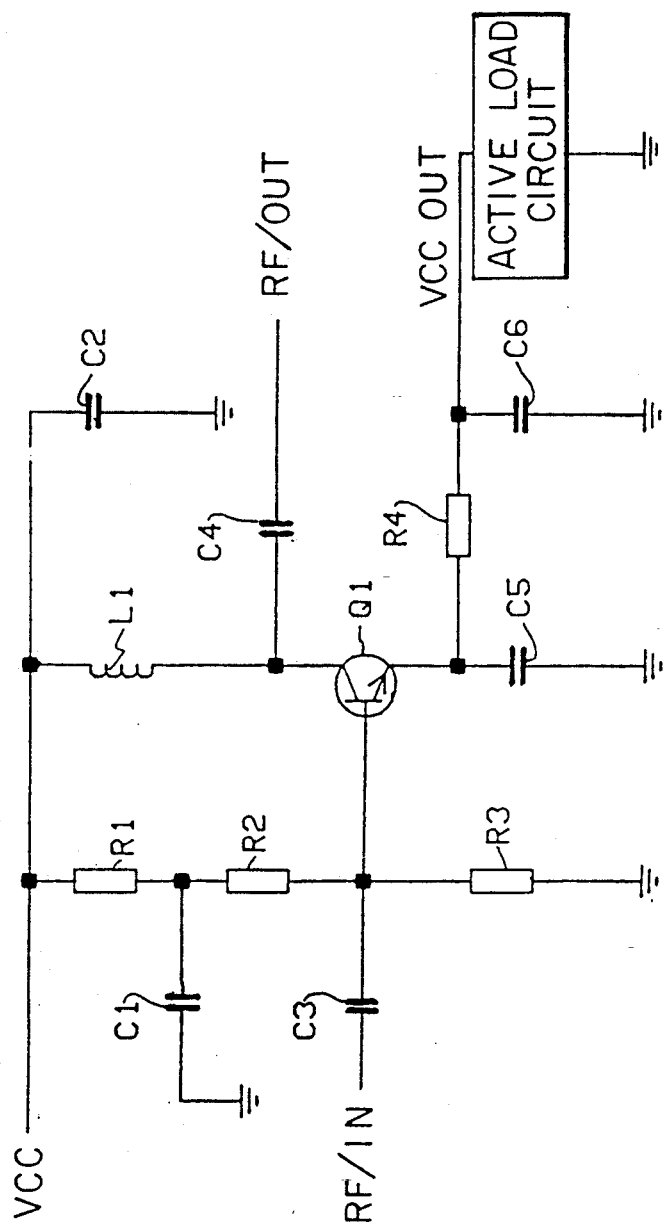
FIG. 1 presents a circuit according a preferable embodiment of the invention.

FIG. 1 presents a circuit arrangement of the invention. The RF amplifier comprises a transistor Q1, resistors R1, R2 and R3, capacitors C1, C2, C3, C4, C5, and a coil L1. The filtering circuit of a supply voltage $V_{cc}$out comprises, excluding the DC separation capacitors C3 and C4 of the RF signals, all components of the RF amplifier circuit, and in addition, the resistor R4 and the capacitor C6.

The amplifier part operates as follows: the voltage dividing resistors R1, R2 and R3 deter-mine the bias voltage of the base of the transistor Q1, and the collector current is determined by the active load M connected to the voltage $V_{cc}$out. Said loading current is expected to be as steady as possible since when approaching the collector current of the transistor, its magnitude affects the gain of the transistor. An appropriate loading M may be, for instance, another amplifier, an IC circuit, or equivalent. The emitter capacitor C5 grounds the emitter at the operational range of the RF amplifier, and the coil L1 provides the impedance matching of the output RFout for the present frequency. The capacitors C3 and C4 are provided for the DC separation of the RF signals, and the C1 is used as a filter for stabilizing the bias voltage. The present circuit operates in the manner of a common emitter amplifier.

As to the filter circuit of the supply voltage $V_{cc}$out, it operates as follows. As regards the voltage $V_{cc}$out, the transistor Q1 serves as an emitter follower, and its bias voltage is determined as already described above, at the resistor division R1, R2, R3. The voltage obtained from the emitter of the current buffer Q1 is conducted through the resistor R4 to be the load voltage $V_{cc}$out. Said voltage is naturally expected to be so high that it suffices for the circuit serving as the load M. The filtering of the supply voltage $V_{cc}$out is performed in circuits R1-C1 and C5-R4-C6.

Figure 2:
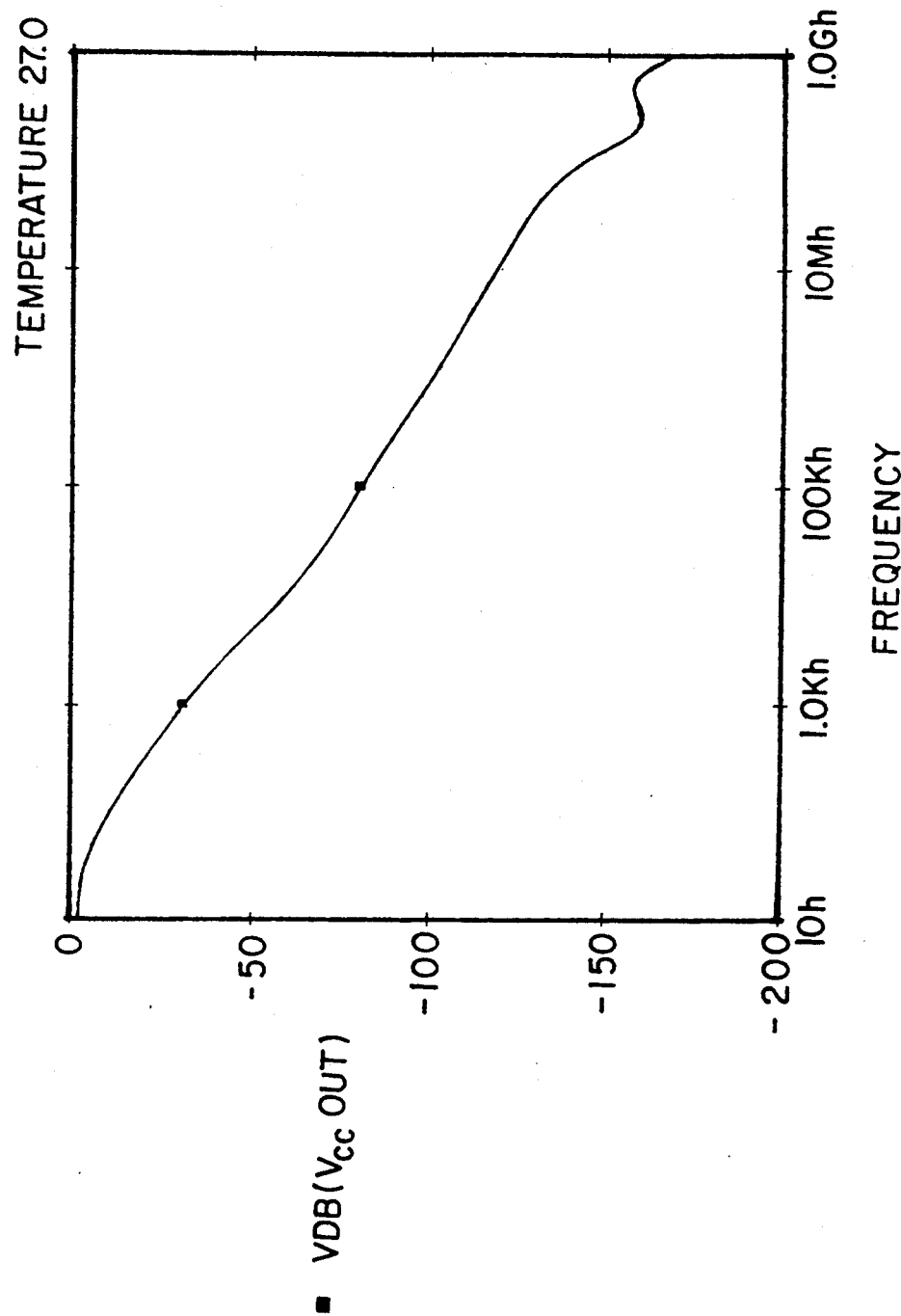
FIG. 2 shows the attenuation measured of the signal between the supply voltages $V_{cc}$ and $V_{cc}$ out.

FIG. 2 shows a simulation of the attenuation of a signal between the supply voltages $V_{cc}$ and $V_{cc}$out. On the horizontal axis, the frequency is 10 Hz to 1G Hz and on the vertical axis, the attenuation is 0 to 200 dB. In the simulated arrangement thereof a 1 kHz signal fed to $V_{cc}$, when viewed from the $V_{cc}$out output, is attenuated 30 dB, and a 100 kHz signal over 80 dB. As regards the filtering of the supply voltage, this attenuation is sufficient. The attenuation is, of course, dependent on the component values used, but this simulation informs, however, of the order of magnitude of attenuation.

Figure 3:
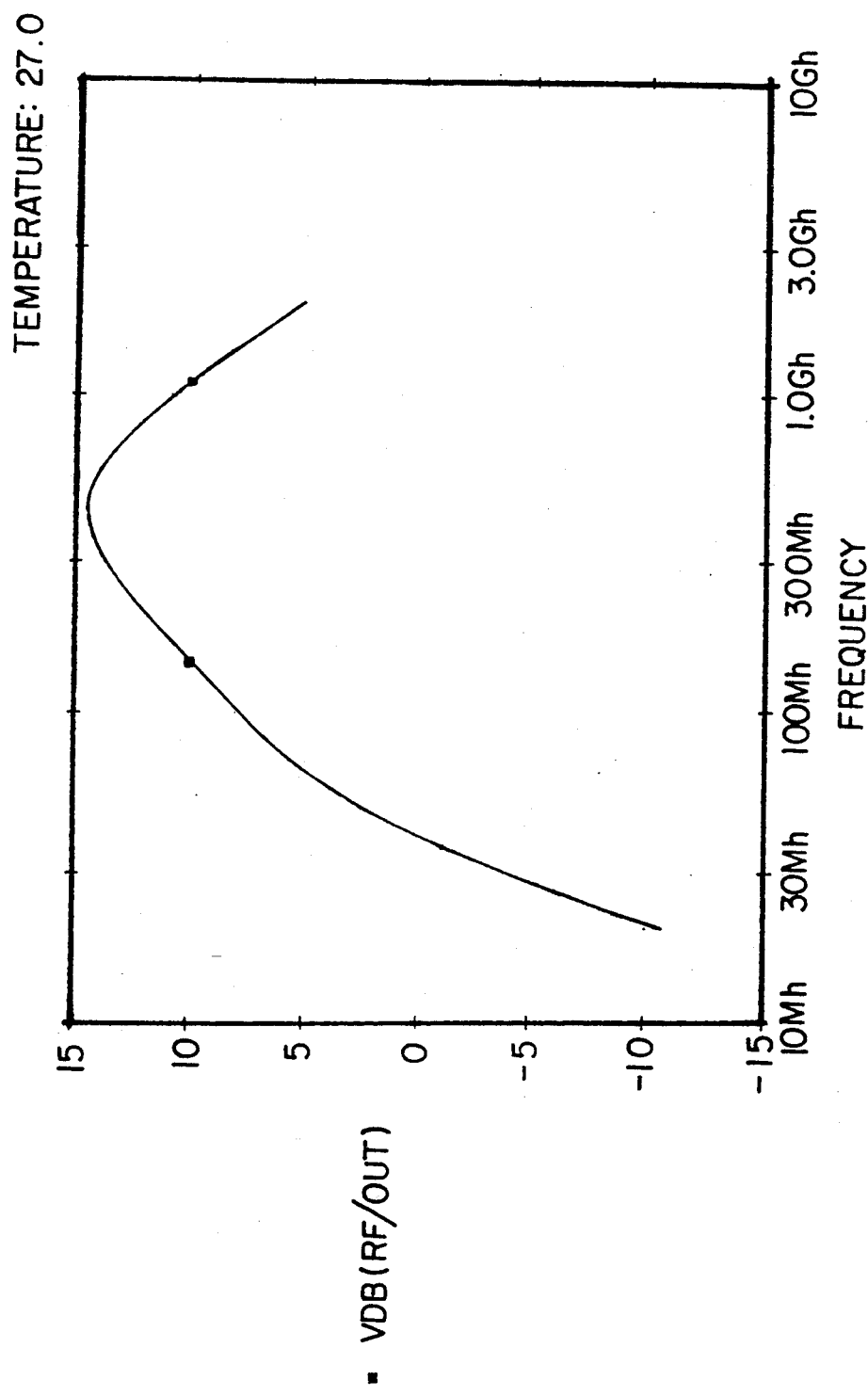
FIG. 3 shows the gain curve between RF/in and RF/out.

In the simulation of FIG. 3 is presented a typical gain curve between RFin and RFout. In the range 150 MHz to 1 GHz, the gain is over 10 dB. Even this value is actually dependent on the component values used.

The arrangement of the invention in which the filtering of the voltage of the amplifier connection produced from the supply voltage and the amplifier itself constitute a combined circuit saves both components and power in comparison with the separate arrangements known in the art because the supply voltage can be utilized efficiently with the described double connection. Remaining within the sphere of the basic construction a practical circuit realization can be implemented in a plurality of ways. Thus, the input matching, the output matching and the biasing of the transistor are implemented to meet the requirements in each instance. The filter section may also comprise a plurality of filtering blocks to be in conformance with the requisite filtering requirements. All of this is obvious to a person skilled in the art and feasible to be implemented within the scope of protection of the claims.

We claim:

1. A circuit arrangement for combining a high frequency amplifier and a filter for providing a second supply voltage produced from a first supply voltage of said amplifier, comprising a high frequency amplifier circuit having an RF inlet and an RF outlet and including a common emitter transistor with ancillary components, the transistor emitter being connected through a capacitor to the ground of the circuit, at RF frequencies said capacitor substantially directly connecting said emitter to circuit ground, said RF outlet being provided at the collector of the transistor, the voltage at the base of the transistor being filtered by at least a portion of said ancillary components, and said second supply voltage being obtained from the emitter of the transistor, a filtering circuit for said second supply voltage including said high frequency amplifier circuit, in said filtering circuit the transistor serving as an emitter follower with said capacitor maintaining said emitter at a high voltage above ground, so as to provide said second supply voltage.

2. A circuit arrangement according to claim 1, wherein the filtering circuit of the second supply voltage includes resistors in the ancillary components of the high frequency amplifier circuit, and capacitors connected to the ground of the circuit.

3. A circuit arrangement according to claim 2, wherein said second supply voltage is further filtered using at least one filter stage connected to the emitter of said transistor.

4. A circuit arrangement according to claim 1, wherein said second supply voltage is a supply voltage for an active circuit receiving a current which is substantially constant, said current being the collector/emitter current of said transistor.

5. A circuit for combining a high frequency amplifier and a filtered second supply voltage source produced from a first supply voltage source of said amplifier, wherein said high frequency amplifier comprises a transistor with ancillary components, the transistor emitter being connected through a capacitor to a circuit ground, at RF frequencies said capacitor substantially directly connecting said emitter to circuit ground, the transistor base being the RF input and the transistor collector being the RF outlet, the voltage at the base of the transistor being filtered, and said second supply voltage source supplying said second supply voltage at the emitter of the transistor, a filtering circuit for said second supply voltage source being said high frequency amplifier, in said second supply voltage source said transistor serves as an emitter follower, an active load being connected between said circuit ground and said second supply voltage source, and carrying the collector/emitter current of said transistor, said capacitor maintaining said emitter at a high voltage above ground, so as to provide said second supply voltage.

6. A circuit arrangement according to claim 5, wherein the filtering circuit of the second supply voltage includes resistors in the ancillary components of the high frequency amplifier, and capacitors connected to the circuit ground.

7. A circuit arrangement according to claim 6, wherein said second supply voltage is further filtered using at least one filter stage connected to the emitter of said transistor.

8. A circuit arrangement according to claim 5, wherein said second supply voltage acts as a supply voltage for an active circuit receiving a current which is substantially constant.

* * * * *